(12) United States Patent
Lu et al.

(10) Patent No.: US 12,324,291 B2
(45) Date of Patent: Jun. 3, 2025

(54) LIGHT-EMITTING SUBSTRATE AND A MANUFACTURING METHOD THEREOF

(71) Applicant: TCL CHINA STAR OPTOELECTRONICS TECHNOLOGY CO., LTD., Guangdong (CN)

(72) Inventors: Huajun Lu, Guangdong (CN); Bin Zhao, Guangdong (CN); Juncheng Xiao, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/609,323

(22) PCT Filed: Sep. 23, 2021

(86) PCT No.: PCT/CN2021/119741
§ 371 (c)(1),
(2) Date: Nov. 5, 2021

(87) PCT Pub. No.: WO2023/035323
PCT Pub. Date: Mar. 16, 2023

(65) Prior Publication Data
US 2024/0030395 A1    Jan. 25, 2024

(30) Foreign Application Priority Data
Sep. 8, 2021   (CN) .......................... 202111051467.5

(51) Int. Cl.
H10H 29/01     (2025.01)
H10H 29/24     (2025.01)
H10H 29/85     (2025.01)

(52) U.S. Cl.
CPC .......... *H10H 29/011* (2025.01); *H10H 29/24* (2025.01); *H10H 29/8508* (2025.01)

(58) Field of Classification Search
CPC ................... H01L 33/62; H01L 33/486; H01L 2933/0066; H01L 33/58; H01L 33/60;
(Continued)

(56) References Cited

U.S. PATENT DOCUMENTS

2016/0135301 A1*   5/2016   Miyake ................. H01L 21/565
                                                         29/832
2021/0193590 A1*   6/2021   Wang ........................ G06T 7/70

FOREIGN PATENT DOCUMENTS

CN      105323979 A     2/2016
CN      205609479 U     9/2016
(Continued)

OTHER PUBLICATIONS

Japanese Office Action issued in corresponding Japanese Patent Application No. 特願 2021-559775 dated Oct. 17, 2023, pp. 1-4.
(Continued)

*Primary Examiner* — Ratisha Mehta
*Assistant Examiner* — Brad A Knudson
(74) *Attorney, Agent, or Firm* — PV IP PC; Wei Te Chung

(57) ABSTRACT

A light-emitting substrate and a manufacturing method thereof are disclosed. In the embodiment of the present disclosure, by providing a groove on a base plate in the manufacturing method of the light-emitting substrate, the accuracy of coating the solder resist ink layer can be improved so as to reduce a distance between the solder resist ink layer and the pad assembly and avoid poor soldering or soldering failure caused by the overflow of the solder resist ink onto the pad.

20 Claims, 5 Drawing Sheets

(58) Field of Classification Search
CPC .... H01L 2933/0033; H01L 2933/0058; H10K 71/13; H10K 71/135; B05D 1/00; B05D 1/26; B05D 1/02
See application file for complete search history.

(56) References Cited

FOREIGN PATENT DOCUMENTS

| CN | 106356353 | A | 1/2017 | | |
|---|---|---|---|---|---|
| CN | 206525017 | U | 9/2017 | | |
| CN | 107636829 | A | 1/2018 | | |
| CN | 207382658 | U | 5/2018 | | |
| CN | 108702842 | A | 10/2018 | | |
| CN | 109786273 | A | 5/2019 | | |
| CN | 110416170 | A | 11/2019 | | |
| CN | 110416248 | A | 11/2019 | | |
| CN | 212209545 | U | 12/2020 | | |
| CN | 112349710 | A | 2/2021 | | |
| JP | S58087380 | U | 6/1983 | | |
| JP | S61110490 | | * | 5/1986 | ............... H05K 3/28 |
| JP | S61110490 | A | 5/1986 | | |
| JP | H0738233 | | * | 2/1995 | ........... H05K 3/0082 |
| JP | 2003046142 | A | 2/2003 | | |
| JP | 2008244186 | A | 10/2008 | | |
| JP | 2012156389 | | * | 8/2012 | |
| JP | 2012156389 | A | 8/2012 | | |
| JP | 2016063132 | A | * | 4/2016 | ... H01L 2224/48227 |
| JP | 2016157918 | A | 9/2016 | | |
| JP | 2019062064 | | * | 4/2019 | ... H01L 2224/48091 |
| JP | 2019062064 | A | 4/2019 | | |
| KR | 20080061816 | A | 7/2008 | | |
| WO | 2015010586 | A1 | 1/2015 | | |

OTHER PUBLICATIONS

International Search Report in International application No. PCT/CN2021/119741, mailed on Jun. 10, 2022.

Written Opinion of the International Search Authority in International application No. PCT/CN2021/119741, mailed on Jun. 10, 2022.

Chinese Office Action issued in corresponding Chinese Patent Application No. 202111051467.5 dated Jul. 22, 2023, pp. 1-8.

* cited by examiner

LIGHT-EMITTING SUBSTRATE AND A MANUFACTURING METHOD THEREOF

RELATED APPLICATIONS

This application is a Notional Phase of PCT Patent Application No. PCT/CN2021/119741 having international filing date of Sep. 23, 2021, which claims the benefit of priority of Chinese Patent Application No. 202111051467.5 filed on Sep. 8, 2021. The contents of the above applications are all incorporated by reference as if fully set forth herein in their entirety.

FIELD OF INVENTION

The present disclosure relates to the field of display technology, and more particularly, to a light-emitting substrate and a manufacturing method thereof.

BACKGROUND OF INVENTION

The main development directions of mini light-emitting diode (Mini-LED, or MLED) technology are backlight and direct display. For whether direct display product or backlight product, the surface of MLED packaging structure is required to be covered with a layer of solder resist ink.

Technical Problem

At present, the requirement for the accuracy of coating the solder resist ink in MLED products is getting higher and higher. That is, a distance between the solder resist ink and a pad is necessarily getting smaller and smaller. However, when trying to improve the accuracy of coating the solder resist ink according to the existing ink coating process, the solder resist ink often overflows onto the pad. That is, the surface of the pad is partially or completely covered with the solder resist ink. Moreover, when the solder pad is covered with the solder resist ink, poor soldering or soldering failure often occurs in the subsequent soldering process with LED chips.

SUMMARY OF INVENTION

Technical Solutions

A light-emitting substrate and a manufacturing method thereof are disclosed in the embodiments of the present disclosure, which may avoid poor soldering or soldering failure caused by the overflow of the solder resist ink onto the pad.

In a first aspect, the embodiments of the present disclosure provide a manufacturing method of a light-emitting substrate, which includes:
- a first substrate is provided, wherein the first substrate includes a base plate and a pad assembly, and the pad assembly is mounted on a mounting surface of the base plate;
- a groove is formed on the mounting surface of the base plate, wherein the groove is defined in a periphery of the pad assembly;
- a solder resist ink is applied on the mounting surface of the base plate in a periphery of the groove to form a solder resist ink layer, wherein the solder resist ink layer includes a first ink layer located in the periphery of the groove and a second ink layer located in the groove;
- an LED chip is provided and the LED chip is connected with the pad assembly.

In a second aspect, the embodiments of the present disclosure provide a light-emitting substrate, which includes:
- a base plate having a mounting surface;
- a pad assembly mounted on the mounting surface of the base plate;
- a solder resist ink layer disposed on the mounting surface of the base plate;
- the mounting surface of the base plate is provided with a groove, the groove is defined in a periphery of the pad assembly, and the solder resist ink layer includes a first ink layer located in a periphery of the groove and a second ink layer located in the groove;
- an LED chip connected with the pad assembly.

DESCRIPTION OF DRAWINGS

To describe the technical solutions in the implementations of the present disclosure or in the existing technologies more clearly, the following briefly describes the accompanying drawings for describing the implementations or the existing technologies. Obviously, the accompanying drawings in the following description merely show some implementations of the present disclosure, and a person of ordinary skill in the art can still derive other drawings based on these drawings without creative efforts.

In order to completely understand the present disclosure and the beneficial effects thereof, the description is illustrated below with the accompanying drawings. In the following description, the same reference numerals represent the same parts.

DETAILED DESCRIPTION OF PREFERRED EMBODIMENTS

The technical solutions in the embodiments of the present disclosure are clearly and completely described below in conjunction with the accompanying drawings in the embodiments of the present disclosure. Obviously, the described embodiments are only a part of the embodiments of the present disclosure rather than all of the embodiments. Based on the embodiments in the present disclosure, all other embodiments obtained by a person of ordinary skill in the art without creative efforts fall within the claim scope of the present disclosure.

Figure 1:
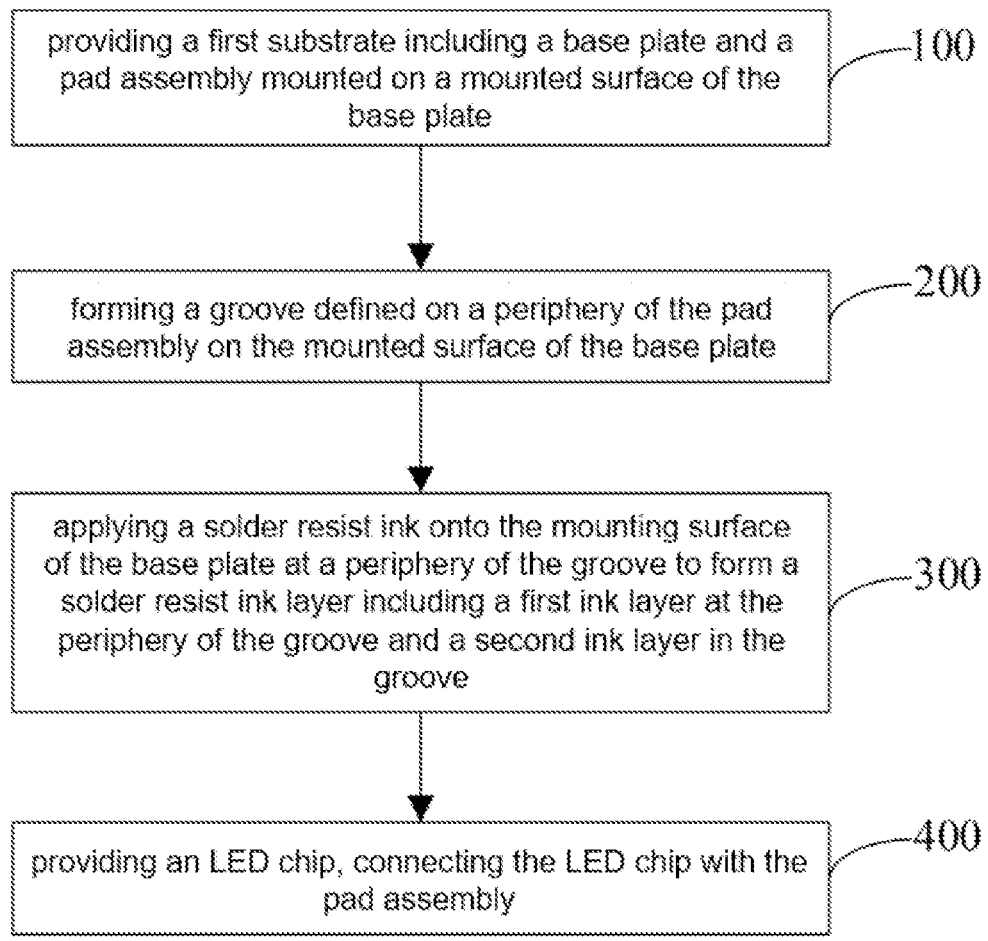
FIG. 1 is a flowchart of a method of manufacturing a light-emitting substrate according to the embodiments of the present disclosure.

Reference is made to FIG. 1. FIG. 1 is a flowchart of a method of manufacturing a light-emitting substrate disclosed in the embodiments of the present disclosure. The embodiments of the present disclosure provide a method of manufacturing a light-emitting substrate, which includes:

Step 100: a first substrate is provided, the first substrate includes a base plate and a pad assembly, and the pad assembly is mounted on a mounting surface of the base plate.

Figure 2:
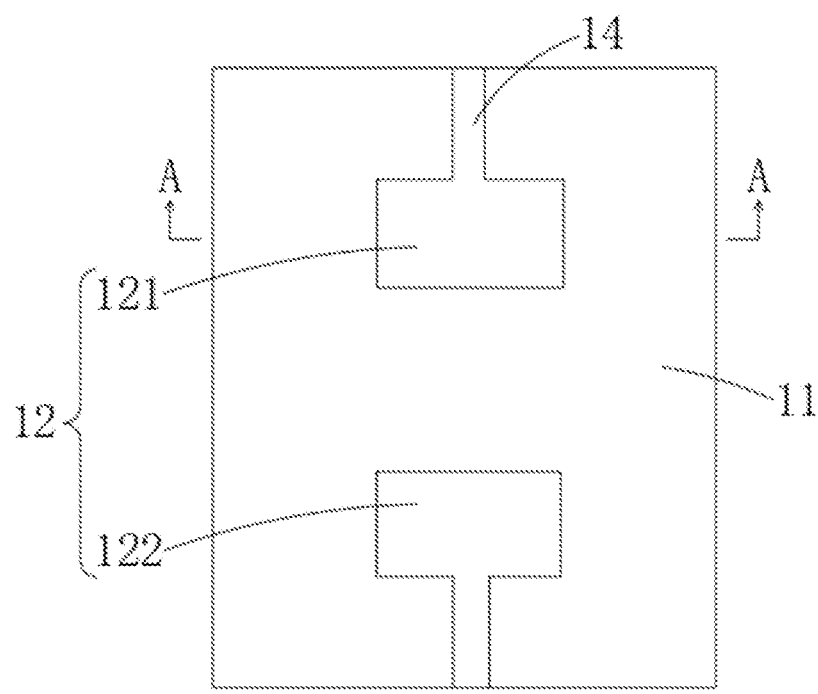
FIG. 2 is a schematic diagram of the step 100 of the manufacturing method in FIG. 1.
Figure 3:
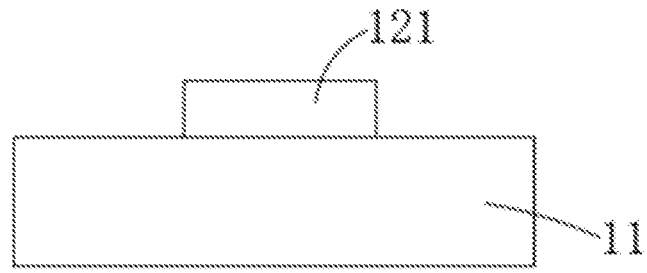
FIG. 3 is a schematic cross-sectional view of the structure in FIG. 2 taken along the A-A direction.

References are made to FIG. 2 and FIG. 3. FIG. 2 is a schematic diagram of the step 100 of the manufacturing method in FIG. 1, and FIG. 3 is a schematic cross-sectional view of the structure in FIG. 2 taken along the A-A direction. The pad assembly 12 may include a first pad 121 and a second pad 122 which are spaced apart from each other. It can be understood that one of the first pad 121 and the second pad 122 may be used for soldering with a positive electrode of an LED chip 30, and the other of the first pad 121 and the second pad 122 may be used for soldering with a negative electrode of the LED chip 30.

In FIG. 2, the first substrate 20 may further include a wire 14 disposed on the mounting surface of the base plate 11, and the wire 14 is connected with the pad assembly 12. Specifically, the first pad 121 and the second pad 122 of the pad assembly 12 are connected with two different wires 14, respectively.

Exemplarily, the material of the base plate 11 may be resin, glass, or the like. The material of the first pad 121 and the material of the second pad 122 may both be metals such as copper (Cu).

Step 200: a groove is formed on the mounting surface of the base plate, and the groove is defined on a periphery of the pad assembly.

Exemplarily, "forming a groove 115 on the mounting surface of the base plate 11" may specifically includes: irradiating the mounting surface of the base plate 11 with a laser beam to form the groove 115 on the mounting surface of the base plate 11.

Figure 4:
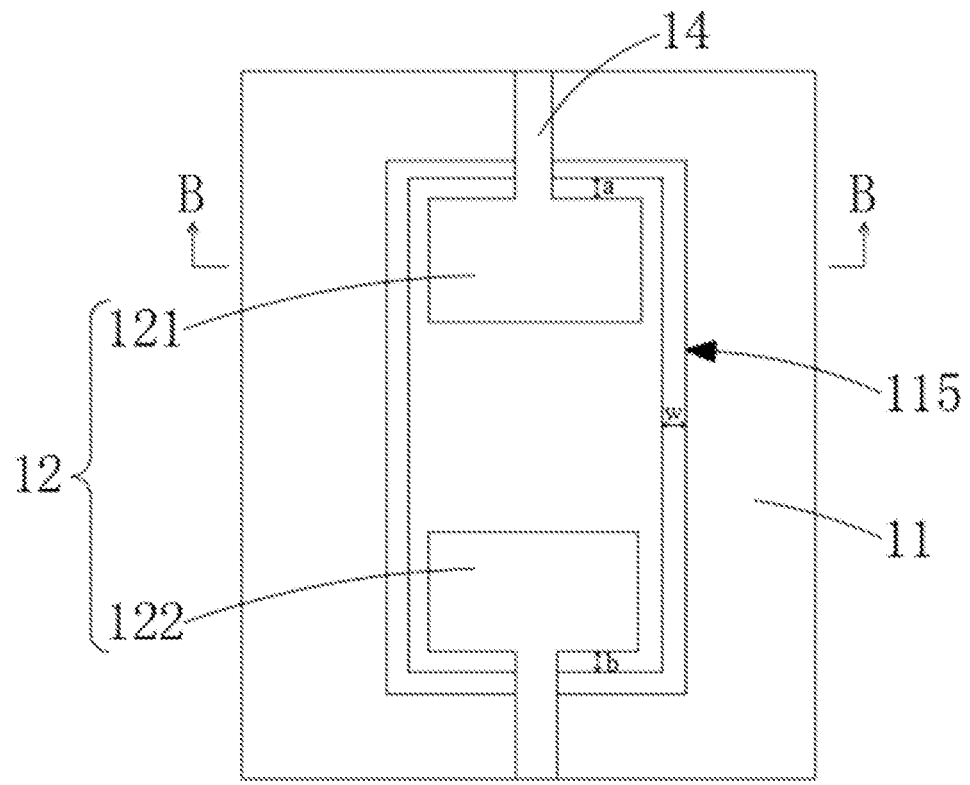
FIG. 4 is a schematic diagram of the step 200 of the manufacturing method in FIG. 1.
Figure 5:
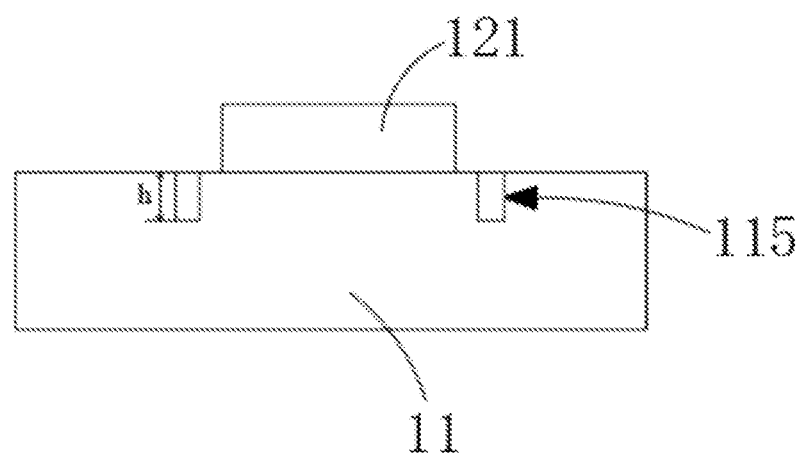
FIG. 5 is a schematic cross-sectional view of the structure in FIG. 4 taken along the B-B direction.

References are made to FIG. 4 and FIG. 5. FIG. 4 is a schematic diagram of the step 200 of the manufacturing method in FIG. 1, and FIG. 5 is a schematic cross-sectional view of the structure in FIG. 4 taken along the B-B direction. When the pad assembly 12 includes the first pad 121 and the second pad 122 which are spaced apart from each other, a distance a between an inner edge of the groove 115 and an outer edge of the first pad 121 may be set as 5 μm-15 μm (e.g., 5 μm, 7 μm, 9 μm, 10 μm, 12 μm, 14 μm, 15 μm, etc.), and a distance b between the inner edge of the groove 115 and an outer edge of the second pad 122 may be set as 5 μm-15 μm (e.g., 5 μm, 7 μm, 9 μm, 10 μm, 12 μm, 14 μm, 15 μm, etc.). It can be understood that the groove 115 may be formed close to the pad assembly 12 due to the high precision of laser processing.

In FIG. 4, it can be seen that the groove 115 is disconnected at the position of the wire 14 to avoid the wire 14. That is, the groove 115 is a non-closed structure.

Exemplarily, the groove 115 may be rectangular on the whole.

Exemplarily, the material of the wire 14 may be a metal such as copper (Cu).

Step 300: a solder resist ink is applied onto the mounting surface of the base plate at a periphery of the groove to form a solder resist ink layer, wherein the solder resist ink layer includes a first ink layer at the periphery of the groove and a second ink layer in the groove.

Figure 6:
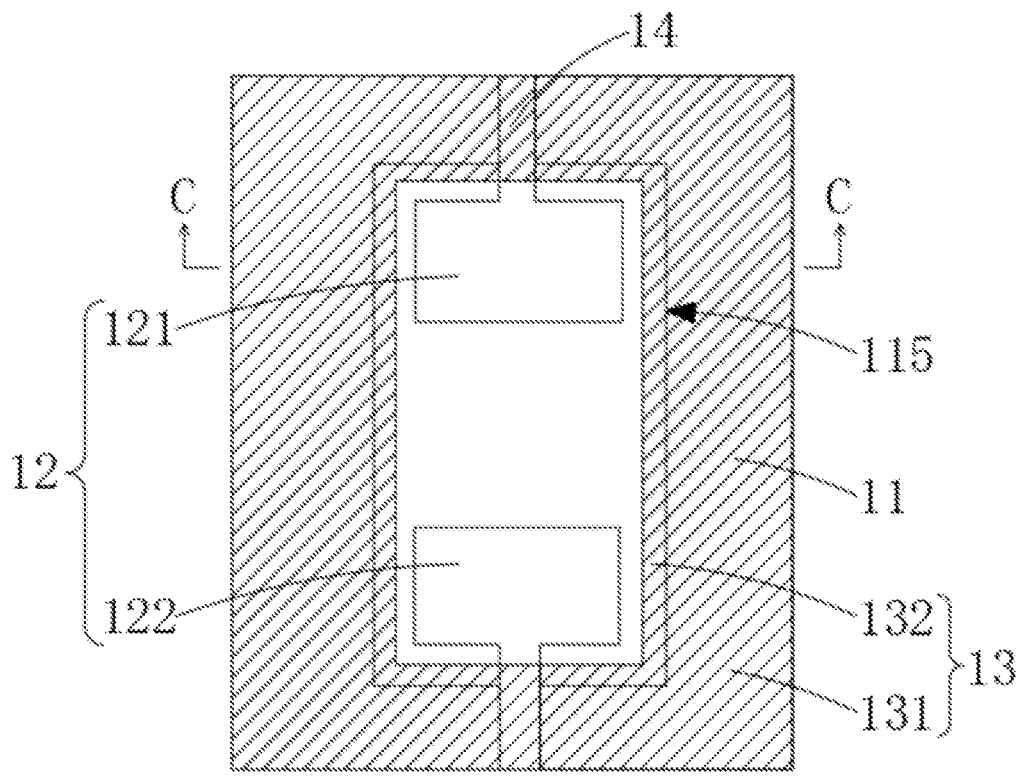
FIG. 6 is a schematic diagram of the step 300 of the manufacturing method in FIG. 1.
Figure 7:
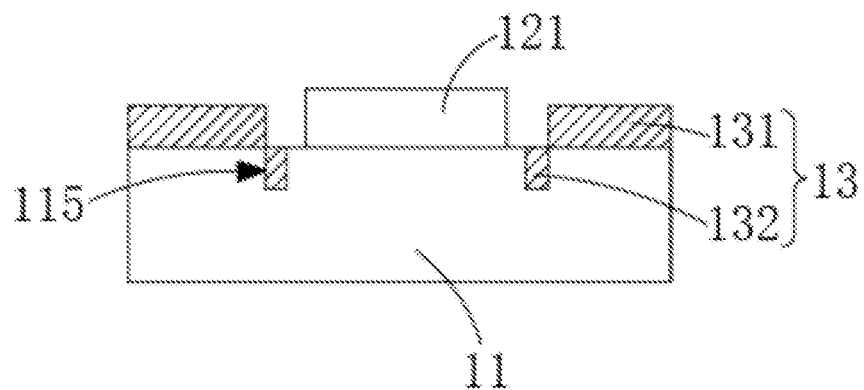
FIG. 7 is a schematic cross-sectional view of the structure in FIG. 6 taken along the C-C direction.

References are made to FIG. 6 and FIG. 7. FIG. 6 is a schematic diagram of the step 300 of the manufacturing method in FIG. 1, and FIG. 7 is a schematic cross-sectional view of the structure in FIG. 6 taken along the C-C direction. "Applying a solder resist ink onto the mounting surface of the base plate at a periphery of the groove" may specifically include: applying the solder resist ink on the mounting surface from a distance to the outer edge of the groove 115, wherein the distance is greater than 0 and less than 5 μm (e.g., 0.5 μm, 1 μm, 2 μm, 3 μm, 4 μm, 5 μm, etc.). It can be understood that the solder resist ink applied on the periphery of the groove 115 may automatically flow into the groove 115 in the direction toward the groove 115 due to the fluidity of the ink, and the second ink layer in the groove 115 is formed after cured. The solder resist ink on the surface of the base plate 11 at the periphery of the groove 115 forms the first ink layer 131 after cured.

It can be understood that the second ink layer 132 may fill the groove 115. That is, a thickness of the second ink layer 132 is equal to a depth of the groove 115 (as shown in FIG. 7). Alternatively, the second ink layer 132 may not completely fill the groove 115. That is, the thickness of the second ink layer 132 is less than the depth of the groove 115.

Exemplarily, the solder resist ink may be applied from the periphery of the groove 115 by ink-jet printing or screen printing.

It can be understood that the solder resist ink may include the following functions.

1. A soldering resist layer, which can prevent short circuit caused by bridging during the soldering process.
2. A protective layer, which protects the wires on the base plate 11 and functions as insulation.
3. Pigments may be added to the solder resist ink layer 13 to play different roles by adding different pigments. For example, white pigments can be added to the solder resist ink layer 13 to form a white ink layer. The white ink layer has strong reflection ability and is suitable for the backlight product to improve the light source utilization of liquid crystal display device. Alternatively, black pigment can also be added to the solder resist ink layer 13 to form a black ink layer. The black ink layer has high contrast and is suitable for the direct display product to improve the contrast and display effect of LED display device.

The requirement for reflectivity of the existing LED backlight product is higher and higher. When the LED backlight product is desired to have the reflectivity of the surrounding white solder resist ink layer 13 to reach more than 90%, the distance between the inner edge of the white solder resist ink layer 13 and the outer edge of the pad is less than 50 μm. That is, the white solder resist ink layer 13 is as close as possible to the pad, and covers all areas around the pad as much as possible. However, due to the limitations of the existing ink printing process, the highest accuracy of ink coating is only 75 μm. Once it is less than 75 μm, the overflow of the ink may occur on the surface of the pad (i.e., the solder resist ink overflows onto the pad), resulting in poor soldering or difficult soldering when soldering the pad with the LED chip, which cannot meet the requirements of the existing LED backlight products for the accuracy of ink coating. It can be understood that the higher accuracy of ink coating means the smaller distance between the inner edge of the ink and the outer edge of the pad. The higher the accuracy of ink coating is, the higher the reflectivity of the LED backlight product with the white solder resist ink layer 13, which can meet the specification design requirements of high-level products. In the embodiments of the present disclosure, by forming the groove 115 on the periphery of the pad assembly 12 on the base plate 11, the solder resist ink applied on the periphery of the groove 115 may be drew by the groove 115, so that the ink automatically overflows into the groove 115, thereby forming a second ink layer 132 close to the pad assembly 12. Due to the high manufacturing accuracy of laser processing, the groove 115 may be formed as close to the pad assembly 12 as possible. At present, the distance between the inner edge of the groove 115 and the outer edge of the pad assembly 12 can be made as 5 μm-15 μm. Since the second ink layer 132 is disposed in the groove 115, the inner edge of the groove 115 is equal to the inner edge of the solder resist ink layer 13. That is, the distance between the inner edge of the solder resist ink layer 13 and the outer edge of the pad assembly 12 (the accuracy of ink coating) is made as 5 μm-15 μm. Therefore, the accuracy of ink coating of the LED backlight product is greatly improved, so that the reflectivity of the LED backlight product can be more than 90%. Moreover, since the groove 115 has a great accommodation capacity and can receive the solder resist ink flowing from the applied site towards the pad assembly 12, poor soldering or soldering failure caused by the overflow of the solder resist ink onto the pad assembly 12 may be also avoid.

Moreover, the pitch (the spacing between pixels) of the existing LED direct display product is smaller and smaller, which means that the requirement for the accuracy of the solder resist ink coating become higher and the solder resist ink is getting closer and closer to the pad. When the pitch of the LED direct display product is made less than 0.6 mm, only BM (black matrix) may be used instead since the existing printing process of the black solder resist ink cannot meet the accuracy requirement. In the method of manufacturing the light-emitting substrate disclosed in the embodiment of the present disclosure, by forming the groove 115 on the periphery of the pad assembly 12 on the base plate 11, the distance between the inner edge of the solder resist ink layer 13 and the outer edge of the pad assembly 12 can be greatly reduced (which may be made as 5 μm-15 μm) by the drainage effect of the groove 115 for the solder resist ink and the advantage of high manufacturing process accuracy of the groove 115 itself, so as to realize high accuracy of ink coating. For the LED direct display product with the black solder resist ink layer 13, the contrast of the LED direct display product can be greatly improved, thereby improving the display effect. Moreover, the overflowed solder resist ink can be accommodated in the groove 115, so as to avoid poor soldering or soldering failure caused by the overflow of the solder resist ink onto the pad assembly 12.

Exemplarily, the width W of the groove 115 may be 30 μm-60 μm (e.g., 30 μm, 35 μm, 40 μm, 45 μm, 50 μm, 55 μm, 60 μm, etc.), and the depth h of the groove 115 may be 15 μm-45 μm (e.g., 15 μm, 20 μm, 25 μm, 30 μm, 35 μm, 40 μm, 45 μm, etc.).

Exemplarily, the thickness of the first ink layer 131 may be 15 μm-45 μm (e.g., 15 μm, 20 μm, 25 μm, 30 μm, 35 μm, 40 μm, 45 μm, etc.), and the thickness of the second ink layer 132 may be 15 μm-45 μm (e.g., 15 μm, 20 μm, 25 μm, 30 μm, 35 μm, 40 μm, 45 μm, etc.).

Step 400: an LED chip is provided and the LED chip is connected with the pad assembly.

Figure 8:
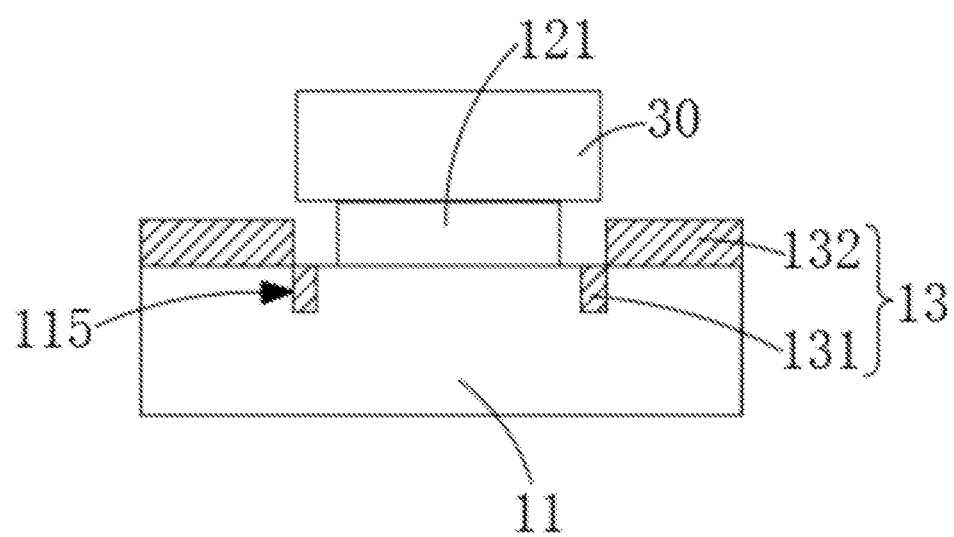
FIG. 8 is a schematic diagram of the step 400 of the manufacturing method in FIG. 1 and a schematic diagram of a light-emitting substrate provided in the embodiments of the present disclosure.

Reference is made to FIG. 8. FIG. 8 is a schematic diagram of the step 400 of the manufacturing method in FIG. 1 and a schematic diagram of the light-emitting substrate disclosed in the embodiments of the present disclosure. The LED chip 30 and the pad assembly 12 can be connected by soldering.

Exemplarily, the LED chip 30 may have a positive electrode and a negative electrode. The positive electrode may be connected to the first pad 121, and the negative electrode may be connected to the second pad 122.

To sum up, in the method of manufacturing the light-emitting substrate disclosed in the embodiments of the present disclosure, by forming the groove 115 on the base plate 11, the solder resist ink applied on the periphery of the groove 115 may be drained by the groove 115, so that the ink automatically overflows into the groove 115, thereby reducing the distance between the solder resist ink layer 13 and the pad assembly 12 and enhancing the accuracy of coating the solder resist ink. Moreover, in the case of ensuring the solder resist ink layer 13 with high coating accuracy, since the groove 115 has the ability to receive the overflowed ink, poor soldering or soldering failure caused by the overflow of the solder resist ink onto the pad assembly 12 may also be avoided. Furthermore, the manufacturing method is simple, and easily realized, and has low production costs.

Reference is made to FIG. 8 in conjunction with FIG. 6 and FIG. 7. A light-emitting substrate 100 is also disclosed in the embodiments of the present disclosure. The light-emitting substrate 100 can be manufactured by the manufacturing method of the light-emitting substrate 100 in any of the aforementioned embodiments. The light-emitting substrate 100 can include a base plate 11, a pad assembly 12, a solder resist ink layer 13, and an LED chip 30. The base plate 11 has a mounting surface. The pad assembly 12 is mounted on the mounting surface of the base plate 11. The solder resist ink layer 13 is disposed on the mounting surface of the base plate 11. The mounting surface of the base plate 11 is provided with a groove 115, and the groove 115 is defined on a periphery of the pad assembly 12. The solder resist ink layer 13 includes a first ink layer 131 located at a periphery of the groove 115 and a second ink layer 132 located in the groove 115. The LED chip 30 is connected with the pad assembly 12.

References are made to FIG. 6 and FIG. 7. The pad assembly 12 may include a first pad 121 and a second pad 122 which are spaced apart from each other. The distance a between the inner edge of the groove 115 and the outer edge of the first pad 121 is 5 μm-15 μm (e.g., 5 μm, 7 μm, 9 μm, 10 μm, 12 μm, 14 μm, 15 μm, etc.), and the distance b between the inner edge of the groove 115 and the outer edge of the second pad 122 is 5 μm-15 μm (e.g., 5 μm, 7 μm, 9 μm, 10 μm, 12 μm, 14 μm, 15 μm, etc.).

References are made to FIG. 4 and FIG. 6. The light-emitting substrate 100 may further include a wire 14 disposed on the mounting surface of the base plate 11, and the wire 14 is connected with the pad assembly 12. The groove 115 is disconnected at the position of the wire 14 to avoid the wire 14. Specifically, the first pad 121 and the second pad 122 of the pad assembly 12 are connected with two different wires 14, respectively.

Exemplarily, the width W of the groove 115 may be 30 μm-60 μm (e.g., 30 μm, 35 μm, 40 μm, 45 μm, 50 μm, 55 μm, 60 μm, etc.), and the depth h of the groove 115 may be 15 μm-45 μm (e.g., 15 μm, 20 μm, 25 μm, 30 μm, 35 μm, 40 μm, 45 μm, etc.).

For example, the thickness of the first ink layer 131 may be 15 μm-45 μm (e.g., 15 μm, 20 μm, 25 μm, 30 μm, 35 μm, 40 μm, 45 μm, etc.), and the thickness of the second ink layer 132 may be 15 μm-45 μm (e.g., 15 μm, 20 μm, 25 μm, 30 μm, 35 μm, 40 μm, 45 μm, etc.).

It can be understood that the second ink layer 132 may fill the groove 11. That is, the thickness of the second ink layer 132 is equal to the depth of the groove 115 (as shown in FIG. 7). Alternatively, the second ink layer 132 may not completely fill the groove 115. That is, the thickness of the second ink layer 132 is less than the depth of the groove 115.

Exemplarily, the material of the base plate 11 may be resin, glass, or the like. The material of the first pad 121 and the material of the second pad 122 may be both metals such as copper (Cu). The material of the wire 14 may be a metal such as copper (Cu).

Exemplarily, the groove 115 may be rectangular on the whole.

Exemplarily, the LED chip 30 and the pad assembly 12 are connected by soldering.

Exemplarily, the LED chip 30 may have a positive electrode and a negative electrode. The positive electrode may be connected to the first pad 121, and the negative electrode may be connected to the second pad 122.

The light-emitting substrate 100 may be a backlight product. That is, it can be applied to a liquid crystal display device to provide a light source for a liquid crystal panel.

The light-emitting substrate 100 may also be a direct display product. That is, it can be used directly as a display device.

In the light-emitting substrate 100 disclosed in the embodiments of the present disclosure, by forming the groove 115 on the periphery of the pad assembly 12 on the base plate 11, the inner edge of the solder resist ink layer 13 can extend to the inner edge of the groove 115. Due to the high manufacturing process accuracy of the groove 115, i.e., the inner edge of the groove 115 may be as close to the pad assembly 12 as possible, the distance between the inner edge of the solder resist ink layer 13 and the outer edge of the pad assembly 12 is shortened, thereby improving the accuracy of coating the solder resist ink layer 13. Moreover, in the case of ensuring the solder resist ink layer 13 with high coating accuracy, since the groove 115 has the ability to accommodate the overflowed ink, poor soldering or soldering failure caused by the overflow of the solder resist ink onto the pad assembly 12 may also be avoided. Furthermore, the structure of the light-emitting substrate 100 is simple, and easy to be manufactured, and has low production costs. Moreover, since the coating accuracy of the solder resist ink layer 13 in the light-emitting substrate 100 is high, the reflectivity of the backlight product can be improved when the light-emitting substrate 100 is used as a backlight product (i.e., the solder resist ink layer 13 is a white ink). When the light-emitting substrate 100 is used as a direct display product (i.e., the solder resist ink layer 13 is a black ink), the contrast of the direct display product can be enhanced, so as to improve the display effect. Therefore, the light-emitting substrate 100 can meet the specification design requirements of a variety of high-level products.

The above is a detailed introduction to a light-emitting substrate and a manufacturing method thereof disclosed in the embodiments of the present disclosure. Specific examples are used in this article to explain the principles and implementations of the present disclosure. The description of the above embodiments is only used to help understand the method of application and its core idea. Moreover, for those skilled in the art, according to the idea of the present disclosure, there may be changes in the specific implementation and the scope of the present disclosure. In summary, the content of this specification should not be understood as restrictions on the present disclosure.

What is claimed is:

1. A method for manufacturing a light-emitting substrate, comprising:

providing a first substrate, wherein the first substrate comprises a base plate and a pad assembly, and the pad assembly is mounted on a mounting surface of the base plate;

forming a groove on the mounting surface of the base plate, wherein the groove is defined in a periphery of the pad assembly, and a distance between an inner edge of the groove and an outer edge of the pad assembly ranges from 5 µm to 15 µm;

applying a solder resist ink provided with white pigments on the mounting surface of the base plate in a periphery of the groove to form a solder resist ink layer, wherein the solder resist ink layer comprises a first ink layer located in the periphery of the groove and a second ink layer located in the groove, and a thickness of the second ink layer is less than or equal to a depth of the groove; and providing an LED chip and connecting the LED chip with the pad assembly.

2. The method for manufacturing the light-emitting substrate according to claim 1, wherein the step of forming the groove on the mounting surface of the base plate comprises:

irradiating the mounting surface of the base plate with a laser beam to form the groove on the mounting surface of the base plate.

3. The method for manufacturing the light-emitting substrate according to claim 1, wherein the first substrate further comprises a wire disposed on the mounting surface of the base plate, the wire is connected with the pad assembly, and the groove is disconnected at a position of the wire.

4. The method for manufacturing the light-emitting substrate according to claim 1, wherein the pad assembly comprises a first pad and a second pad which are spaced apart from each other, a distance between an inner edge of the groove and an outer edge of the first pad is 5 µm-15 µm, and a distance between the inner edge of the groove and an outer edge of the second pad is 5 µm-15 µm.

5. The method for manufacturing the light-emitting substrate according to claim 1, wherein the step of applying the solder resist ink on the mounting surface of the base plate in the periphery of the groove comprises:

applying the solder resist ink on the mounting surface from a distance to an outer edge of the groove, wherein the distance is greater than 0 µm and less than 5 µm.

6. The method for manufacturing the light-emitting substrate according to claim 1, wherein a width of the groove is 30 µm-60 µm.

7. The method for manufacturing the light-emitting substrate according to claim 1, wherein a depth of the groove is 15 µm-45 µm.

8. The method for manufacturing the light-emitting substrate according to claim 1, wherein the step of connecting the LED chip with the pad assembly comprises:

connecting the LED chip with the pad assembly by soldering.

9. The method for manufacturing the light-emitting substrate according to claim 1, wherein the step of applying the solder resist ink on the mounting surface of the base plate in the periphery of the groove comprises:

applying the solder resist ink in the periphery of the groove by ink-jet printing or screen printing.

10. The method for manufacturing the light-emitting substrate according to claim 4, wherein materials of the first pad and the second pad both are metal.

11. A light-emitting substrate, comprising:

a base plate having a mounting surface;

a pad assembly mounted on the mounting surface of the base plate;

a white solder resist ink layer disposed on the mounting surface of the base plate, wherein the mounting surface of the base plate is provided with a groove, the groove is defined in a periphery of the pad assembly, and the white solder resist ink layer comprises a first ink layer located in a periphery of the groove and a second ink layer located in the groove; and an LED chip connected with the pad assembly;

wherein a distance between an inner edge of the groove and an outer edge of the pad assembly ranges from 5 μm to 15 μm.

12. The light-emitting substrate according to claim 11, wherein the light-emitting substrate further comprises a wire disposed on the mounting surface of the base plate, the wire is connected with the pad assembly, and the groove is disconnected at a position of the wire.

13. The light-emitting substrate according to claim 11, wherein the pad assembly comprises a first pad and a second pad which are spaced apart from each other, a distance between an inner edge of the groove and an outer edge of the first pad is 5 μm-15 μm, and a distance between the inner edge of the groove and an outer edge of the second pad is 5 μm-15 μm.

14. The light-emitting substrate according to claim 11, wherein a width of the groove is 30 μm-60 μm.

15. The light-emitting substrate according to claim 11, wherein a depth of the groove is 15 μm-45 μm.

16. The light-emitting substrate according to claim 11, wherein a thickness of the first ink layer is 15 μm-45 μm.

17. The light-emitting substrate according to claim 11, wherein a thickness of the second ink layer is 15 μm-45 μm.

18. The light-emitting substrate according to claim 11, wherein the LED chip and the pad assembly are connected by soldering.

19. The light-emitting substrate according to claim 13, wherein materials of the first pad and the second pad are metal.

20. The light-emitting substrate according to claim 11, wherein a material of the base plate is resin or glass.

* * * * *